(12) United States Patent
Ting et al.

(10) Patent No.: US 12,347,811 B2
(45) Date of Patent: Jul. 1, 2025

(54) ELECTRONIC DEVICE INCLUDING ELECTRONIC COMPONENT RECEIVING POWER FROM TWO SIDES

(71) Applicant: Advanced Semiconductor Engineering, Inc., Kaohsiung (TW)

(72) Inventors: Chun-Yen Ting, Kaohsiung (TW); Pao-Nan Lee, Kaohsiung (TW); Jung Jui Kang, Kaohsiung (TW); Chang Chi Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 443 days.

(21) Appl. No.: 17/846,642

(22) Filed: Jun. 22, 2022

(65) Prior Publication Data

US 2023/0420418 A1 Dec. 28, 2023

(51) Int. Cl.
*H01L 25/065* (2023.01)

(52) U.S. Cl.
CPC .............. *H01L 25/0657* (2013.01); *H01L 2225/06544* (2013.01); *H01L 2225/06558* (2013.01); *H01L 2225/06589* (2013.01)

(58) Field of Classification Search
None
See application file for complete search history.

(56) References Cited

U.S. PATENT DOCUMENTS

| | | | |
|---|---|---|---|
| 8,198,716 B2 | 6/2012 | Periaman et al. | |
| 8,697,495 B2 | 4/2014 | Cheah et al. | |
| 10,529,677 B2 * | 1/2020 | Yudanov | H01L 24/49 |
| 2003/0122239 A1 * | 7/2003 | Song | H01L 23/49575 |
| | | | 257/686 |
| 2014/0225248 A1 | 8/2014 | Henderson et al. | |
| 2019/0333876 A1 * | 10/2019 | Yudanov | H01L 23/645 |
| 2022/0139880 A1 * | 5/2022 | Lee | H01L 25/0657 |
| | | | 257/621 |
| 2023/0377679 A1 * | 11/2023 | Lee | G11C 29/785 |
| 2023/0377949 A1 * | 11/2023 | Syue | H01L 23/481 |

* cited by examiner

*Primary Examiner* — Nduka E Ojeh
(74) *Attorney, Agent, or Firm* — FOLEY & LARDNER LLP

(57) ABSTRACT

An electronic device is provided. The electronic device includes a first die and a second die. The second die is disposed over the first die. A backside surface of the second die faces a backside surface of the first die. An active surface of the second die is configured to receive a first power. The second die is configured to provide the first die with a second power through the backside surface of the second die and the backside surface of the first die.

18 Claims, 5 Drawing Sheets

ELECTRONIC DEVICE INCLUDING ELECTRONIC COMPONENT RECEIVING POWER FROM TWO SIDES

BACKGROUND

1. Field of the Disclosure

The present disclosure relates to an electronic device, in particularly to an electronic device integrating electronic components of different powers.

2. Description of the Related Art

When different electronic components, such as a memory device and an application-specific integrated circuit (ASIC), are integrated, the distance therebetween and the number of input/output terminals can affect performance. However, it is difficult to rectify such needs for shorter distance and a more input/output terminals. In order to provide the desired enhancement in performance, a new electronic device is required.

SUMMARY

In some embodiments, an electronic device includes a first die and a second die. The second die is disposed over the first die. A backside surface of the second die faces a backside surface of the first die. An active surface of the second die is configured to receive a first power. The second die is configured to provide the first die with a second power through the backside surface of the second die and the backside surface of the first die. The first power is different from the second power.

In some embodiments, an electronic device includes a first die and a second die. The second die is disposed over the first die. The first die is configured to receive a first power and a second power. The first power is transmitted from the second die. The second power is free from passing through the second die. The first power is different from the second power.

In some embodiments, an electronic device includes a first substrate, a first electronic component and a second electronic component. The first electronic component is disposed over the first substrate and has a backside surface. The second electronic component is disposed over the backside surface of the first electronic component. The second electronic component has a backside surface facing the backside surface of the first electronic component. The first electronic component is configured to receive a first power passing through the backside surface of the first electronic component and a second power different from the first power.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
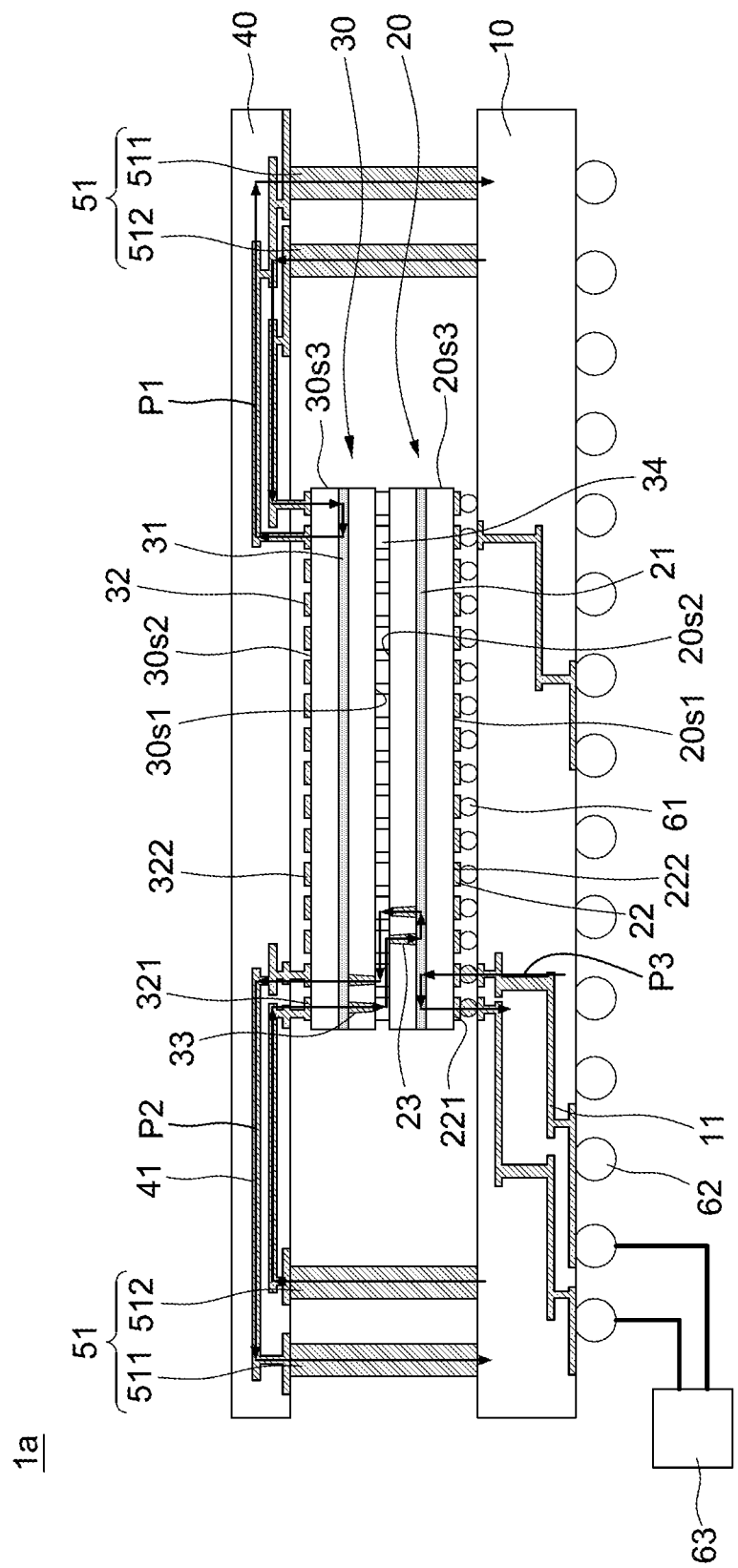
FIG. 1 illustrates a cross-sectional view of an example of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of an example of an electronic device 1a according to some embodiments of the present disclosure. In some embodiments, the electronic device 1a may include a substrate 10, an electronic component 20, an electronic component 30, a substrate 40, and conductive structures 51.

In some embodiments, the substrate 10 may be configured to support the electronic component 20. In some embodiments, the substrate 10 may be configured to support the conductive structure 51. In some embodiments, the substrate 10 may include a circuit 11. In some embodiments, the substrate 10 may include at least one dielectric layer and a redistribution structure, traces, and/or circuit (e.g., 11), for electrical connection between components, embedded in the dielectric layer. In some embodiments, the substrate 10 may include a circuit board, such as a paper-based copper foil laminate, a composite copper foil laminate, or a polymer-impregnated glass-fiber-based copper foil laminate. In some embodiments, the substrate 10 may include a semiconductor substrate. For example, the substrate 10 may include silicon, germanium or other suitable materials.

The electronic component 20 may be disposed on the substrate 10. The electronic component 20 may be a chip or a die including a semiconductor substrate. The electronic component 20 may include a surface $20s1$ and a surface $20s2$ opposite to the surface $20s1$. The surface $20s1$ may face the substrate 10. In some embodiments, the surface $20s1$ may be referred to as an active surface, and the surface $20s2$ may be referred to as a backside surface (or a rear surface). As used herein, the term "active surface" may refer to a surface on which active circuits (e.g., ICs) and/or transistors are disposed or formed. The electronic component 20 may include a surface 20$s$3 extending between the surfaces 20$s$1 and 20$s$2 of the electronic component 20. The surface 20$s$3 may also be referred to as a lateral surface or a side of the electronic component 20.

The electronic component 20 may include an active circuit 21 (or active circuit region). In some embodiments, the active circuit 21 may be adjacent to the surface 20$s$1 of the electronic component 20. The active circuit 21 may include one or more integrated circuit (IC) devices and one or more overlying interconnection structures therein. The IC devices may include active devices such as transistors and/or passive devices such as resistors, capacitors, inductors, or a combination thereof. For example, the active circuit 21 may include an application-specific IC (ASIC), a memory integrated circuit, a radio frequency integrated circuit (RFIC), a central processing unit (CPU), a microprocessor unit (MPU), a graphics processing unit (GPU), a microcontroller unit (MCU), a field-programmable gate array (FPGA), a power management IC (PMIC), or other type of IC. In some embodiments, the active circuit 21 may include two or more different ICs, which need different voltages (or powers).

The electronic component 20 may include a plurality of terminals 22. The terminal 22 may be disposed on the surface 20$s$1 of the electronic component 20. The terminal 22 may be electrically connected to the substrate 10 through electrical connections 61 (e.g., solder material or other suitable materials). In some embodiments, the terminal 22 may include a conductive pad or other suitable elements. The terminal may include conductive materials, such as copper (Cu), aluminum (Al), tungsten (W), titanium (Ti), tantalum (Ta), or other applicable materials. In some embodiments, the terminal 22 may include power terminals 221 and input and output (I/O) terminals 222. The power terminal 221 may be configured to receive and/or transmit a power signal (e.g., supply voltage/current, ground, or the like). For example, the power signal may be transmitted through the PMIC of the electronic component 20 via the power terminal 221. The I/O terminal 222 may be configured to receive and/or transmit a data signal (e.g., digital signal, analog signal, radio frequency (RF) signal or the like) of the electronic component 20, thereby performing the function(s) of other ICs of the electronic component 20.

The electronic component 20 may include through-via(s) 23. In some embodiments, the through-via 23 may include a silicon-through via (TSV). The through-via 23 may extend between the surface 20$s$2 and the active circuit 21 of the electronic component 20. In some embodiments, the through-via 23 may be configured to receive and/or transmit a power signal to the active circuit 21 of the electronic component 20.

The electronic component 30 may be disposed on the electronic component 20. In some embodiments, the electronic component 30 may be disposed on the surface 20$s$2 of the electronic component 20. The electronic component 30 may be a chip or a die including a semiconductor substrate. The electronic component 30 may include a surface 30$s$1 and a surface 30$s$2 opposite to the surface 30$s$1. The surface 30$s$1 may face the surface 20$s$2 of the electronic component 20. The surface 30$s$1 of the electronic component 30 may be exposed by the electronic component 20. In some embodiments, the surface 30$s$1 may be referred to as a backside surface, and the surface 30$s$2 may be referred to as an active surface. The electronic component 30 may include a surface 30$s$3 extending between the surfaces 30$s$1 and 30$s$2 of the electronic component 30. The surface 30$s$3 may also be referred to as a lateral surface or a side of the electronic component 30.

The electronic component 30 may include an active circuit 31 (or active circuit region). In some embodiments, the active circuit 31 may be adjacent to the surface 30$s$2 of the electronic component 30. The active circuit 31 may include one or more IC devices and one or more overlying interconnection structures therein. For example, the active circuit 31 may include a memory IC, an ASIC, an RFIC, a CPU, a MPU, a GPU, a MCU, a FPGA, a PMIC, or another type of IC. In some embodiments, the active circuit 21 may be different from the active circuit 31. In some embodiments, the electronic component 20 may include an ASIC, and the electronic component 30 may include a memory IC. In some embodiments, a circuit (not shown) is disposed between the conductive pad 34 and the through-via 33 of the electronic component 30, which may be configured to transmit signal(s).

The electronic component 30 may include a plurality of terminals 32. The terminal 32 may be disposed on the surface 30$s$2 of the electronic component 30. In some embodiments, the terminal 32 may include power terminals 321 and I/O terminals 322. The power terminal 321 may be configured to receive and/or transmit a power signal of the electronic component 30. For example, the power signal may be transmitted through the PMIC of the electronic component 30 via the power terminal 321. The I/O terminal 322 may be configured to receive and/or transmit a data signal of the electronic component 30, thereby performing the function(s) of other ICs of the electronic component 30.

The electronic component 30 may include through-via(s) 33. In some embodiments, the through-via 33 may include a silicon-through via (TSV). The through-via 33 may extend between the surface 30$s$1 and the active circuit 31 of the electronic component 30. In some embodiments, the through-via 33 may be configured to receive and/or transmit a power signal to the electronic component 20.

The electronic component 30 may include conductive pad(s) 34. The conductive pad 34 may be disposed on the surface 30$s$1 of the electronic component 30. In some embodiments, the conductive pad 34 may be exposed by the electronic component 20. In some embodiments, the electronic component 30 may be disposed between the surface 30$s$1 of the electronic component 30 and the surface 20$s$2 of the electronic component 20. In some embodiments, the electronic component 30 may be configured to electrically connect the through-via 23 and through-via 33. In some embodiments, the conductive pad 34 may be configured to receive and/or transmit a power signal to the electronic component 20. The electronic component 20 may be electrically connected to the electronic component 30 by way of flip-chip, wire-bond techniques, metal to metal bonding (such as Cu to Cu bonding), or hybrid bonding.

The substrate 40 may be disposed on the surface 30$s$2 of the electronic component 30. In some embodiments, the substrate 40 may include a circuit 41. In some embodiments, the substrate 40 may include at least one dielectric layer and a redistribution structure, traces, and/or a circuit (e.g., 41), for electrical connection between components, embedded in the dielectric layer. In some embodiments, the substrate 40 may include a circuit board, such as a paper-based copper foil laminate, a composite copper foil laminate, or a polymer-impregnated glass-fiber-based copper foil laminate. In some embodiments, the substrate 40 may include a semiconductor substrate. For example, the substrate 40 may include silicon, germanium, or other suitable materials.

The conductive structure 51 may be disposed on the substrate 10. In some embodiments, the conductive structure 51 may be disposed between the substrates 10 and 40. In some embodiments, the conductive structure 51 may be configured to electrically connect the substrates 10 and 40. In some embodiments, the conductive structure 51 may be disposed adjacent to the surface 20s3 of the electronic component 20. In some embodiments, the conductive structure 51 may be disposed adjacent to the surface 30s3 of the electronic component 20. In some embodiments, the conductive structure 51 may extend across the surface 20s3 of the electronic component and the surface 30s3 of the electronic component 30. In some embodiments, the conductive structure 51 may be a conductive pillar or other suitable elements. The conductive structure 51 may include electrically conductive materials, such as aluminum (Al), copper (Cu), tungsten (W), titanium (Ti), tantalum (Ta), or other applicable materials.

In some embodiments, the electronic device 1a may further include electrical connections 62. The electrical connection 62 may be electrically connected to an external device, such as a power source or other devices. The electrical connection 62 may include, for example, a solder material, such as alloys of gold and tin solder or alloys of silver and tin solder.

In some embodiments, the electronic device 1a may be electrically connected to a power source 63. The power source 63 may provide the electronic device 1a with an external power. For example, the substrate 10 may be electrically connected to the power source 63. The power source 63 may be configured to supply a power signal. In some embodiments, the power source 63 may be configured to provide a direct current. In some embodiments, the power source 63 may be configured to provide a power signal P1 with a voltage (e.g., Vdd). In some embodiments, the power source 63 may be configured to receive a voltage (e.g., Vss).

In some embodiments, the substrate 10 may be configured to provide the electronic component 30 with a power signal P1. In some embodiments, the power signal P1 may pass through the surface 30s2 of the electronic component 30. In some embodiments, the power signal P1 entering the electronic component 30 may include a voltage of Vdd, and the power signal exiting from the electronic component 30 may include a voltage of Vss. In some embodiments, the power signal P1 may further pass through the conductive structure 51. In some embodiments, the power signal P1 may pass across the surface 20s3 of the electronic component 20 without entering the electronic component 20. In some embodiments, the power signal P1 may pass across the surface 30s3 of the electronic component 30. In some embodiments, the power signal P1 may further pass through the substrate 40. In some embodiments, the power signal P1 may pass through the substrate 10, the conductive structure 51 (e.g., conductive structure 512), the substrate 40, the power terminal 321, the active circuit 31, the power terminal 321, the substrate 40, the conductive structure 51 (e.g., conductive structure 511).

In some embodiments, the substrate 10 may be configured to provide the electronic component 20 with a power signal P2. In some embodiments, the power signal P2 may pass through the surface 30s2 of the electronic component 30. In some embodiments, the power signal P2 may pass through the surface 30s1 of the electronic component 30. In some embodiments, the power signal P2 may pass through the surface 20s2 of the electronic component 20. In some embodiments, the electronic component 20 may receive the power signal P2 through the electronic component 30. In some embodiments, the power signal P2 may further pass through the conductive structure 51. In some embodiments, the power signal P2 may further pass through the substrate 40. In some embodiments, the power signal P2 may pass through the substrate 10, the conductive structure 51 (e.g., conductive structure 512), the substrate 40, the power terminal 321, the through-via 33, the conductive pad 34, the through-via 23, the active circuit 21, the through-via 23, the conductive pad 34, the through-via 33, the power terminal 321, the substrate 40, and the conductive structure 51 (e.g., conductive structure 511). In some embodiments, the voltage (or power) of the power signal P1 may be different from the voltage (or power) of the power signal P2.

In some embodiments, the substrate 10 may be configured to provide the electronic component 20 with a power signal P3. In some embodiments, the power signal P3 may pass through the surface 20s1 of the electronic component 20. In some embodiments, the power signal P3 may be free of passing through the electronic component 30. In some embodiments, the power signal P3 may pass through the substrate 10, the electrical connection 61, the power terminal 221, the active circuit 21, the power terminal 221, and the electrical connection 61. In some embodiments, the voltage (or power) of the power signal P3 may be substantially the same as the voltage (or power) of the power signal P2. In some embodiments, the voltage (or power) of the power signal P3 may be different from the voltage (or power) of the power signal P2. For example, the electronic component 20 may be configured to receive a first power from the active surface (e.g., 20s1) of the electronic component and to receive a second power which is transmitted from the electronic component 30, wherein the first power is different from the second power.

In some embodiments, the electronic device 1a may include an encapsulant (not shown in the figures). In some embodiments, the encapsulant may cover the substrate 10. In some embodiments, the encapsulant may cover the substrate 40. In some embodiments, the encapsulant may cover the electronic component 20. In some embodiments, the encapsulant may cover the electronic component 30. In some embodiments, the encapsulant may cover and/or protect the conductive structure 51. The encapsulant may include insulation or dielectric material. For example, the encapsulant may include a molding compound. In some embodiments, the encapsulant may be made of molding material that may include, for example, a Novolac-based resin, an epoxy-based resin, a silicone-based resin, or other another suitable encapsulant. Suitable fillers may also be included, such as powdered $SiO_2$.

In some embodiments, the electronic component 30 may have a relatively large number of power terminals to transmit and/or receive the power terminal of the electronic components 20 and 30. In some embodiments, the density of the I/O terminals 222 of the electronic component 20 may be greater than the density of the I/O terminals 322 of the electronic component 30. In this disclosure, the term "density of the terminal" may refer to the number of terminals per unit area. In some situations, it is required that the electronic component 20 have much more I/O terminals 222. In order to prevent all of power terminals 221 from occupying the active surface (e.g., 20s1) of the electronic component 20, some of power signals may be transmitted from the power signal P2. As a result, the active surface of the electronic component 20 has a relatively large area to let the I/O terminals 222 be disposed on.

In a comparative electronic device, an upper die may be configured to provide a lower die with a power signal, wherein the lower die receives only a power signal with one path. In some cases, the lower die and the upper die perform different functions and require different voltages of power signals. Further, the lower die functions as, for example, an ASIC die and thus requires different voltages of power signals and more I/O terminals to deal with multiple functions. In such situations, the comparative electronic device cannot satisfy such design requirement. In the embodiments of the present disclosure, a lower die (e.g., electronic component 20) can receive power signals either from an upper die (e.g., electronic component 30), a substrate or both. As a result, more terminals (e.g., terminals 22) of the electronic component 20 can be utilized to function as input /output (I/O) terminals (e.g., 222).

Figure 2:
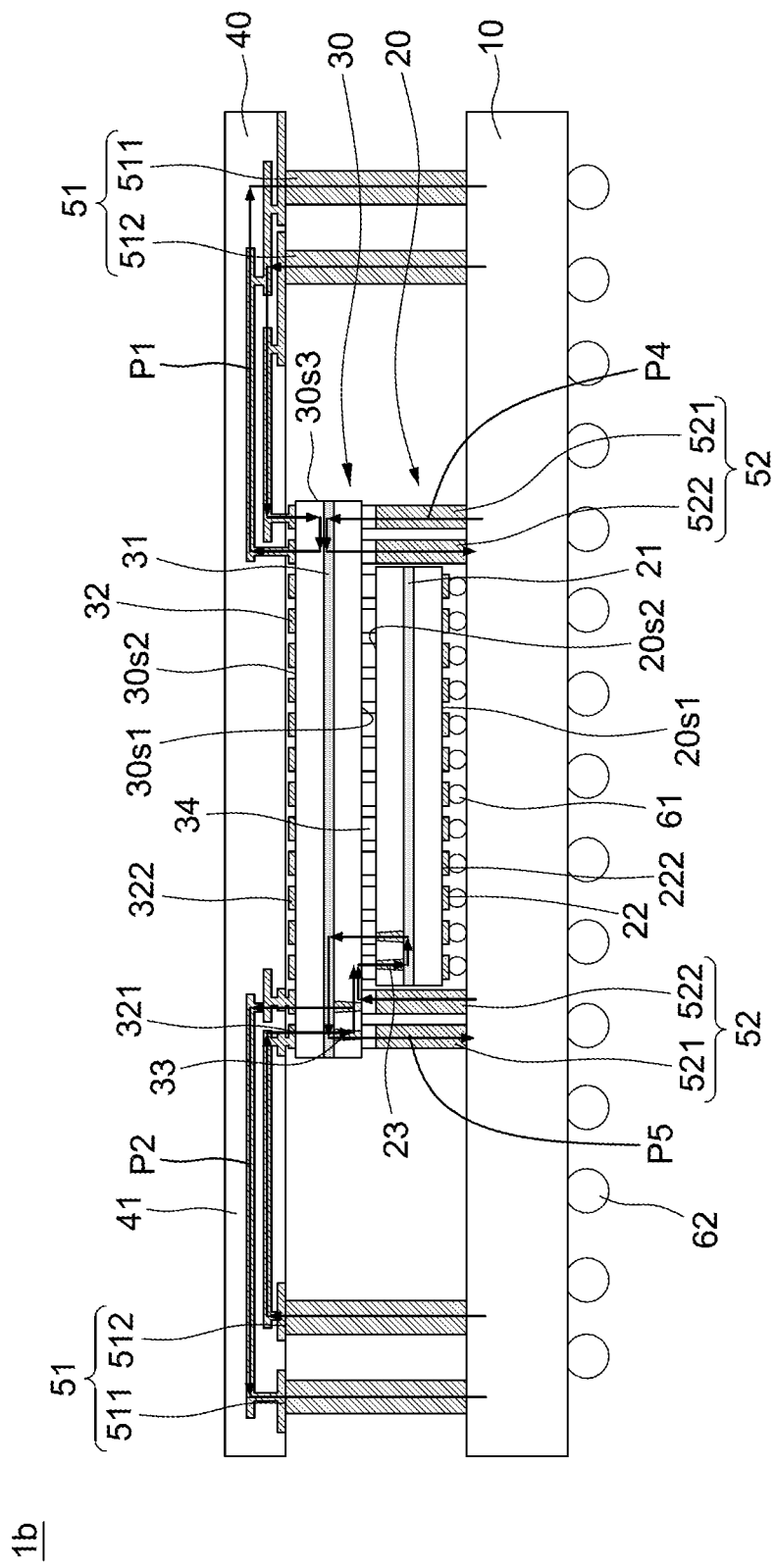
FIG. 2 illustrates a cross-sectional view of an example of an electronic device according to some embodiments of the present disclosure.

FIG. 2 illustrates a cross-sectional view of an example of an electronic device 1*b* according to some embodiments of the present disclosure. The electronic device 1*b* is similar to the electronic device 1*a* as shown in FIG. 1, and the differences therebetween are described below.

In some embodiments, the size of the electronic component 20 may be different from that of the electronic component 30. In some embodiments, the surface area of the electronic component 20 may be different from that of the electronic component 30. For example, the X/Y-dimensions of the electronic component 30 may exceed those of the electronic component 20.

In some embodiments, the electronic device 1*b* may further include conductive structure(s) 52. In some embodiments, the conductive structure 52 may be disposed on the substrate 10. In some embodiments, the conductive structure 52 may be disposed on the surface 30*s*1 of the electronic component 30. In some embodiments, the conductive structure 52 may be disposed between the substrate 10 and the electronic component 30. In some embodiments, the conductive structure 52 may be disposed adjacent to the surface 20*s*3 of the electronic component 20. In some embodiments, the conductive structure 52 may extend across the surface 20*s*3 of the electronic component 20. In some embodiments, the conductive structure 52 may be configured to electrically connect the substrate 10 and the electronic component 20. In some embodiments, the conductive structure 52 may be configured to electrically connect the substrate 10 and the electronic component 30. In some embodiments, the conductive structure 52 may be a conductive pillar or other suitable elements. The conductive structure 52 may include electrically conductive materials, such as aluminum (Al), copper (Cu), tungsten (W), titanium (Ti), tantalum (Ta), or other applicable materials.

In some embodiments, the substrate 10 may be configured to provide the electronic component 30 with a power signal P4. In some embodiments, the power signal P4 may pass through the surface 30*s*1 of the electronic component 30. In some embodiments, the power signal P4 may further pass through the conductive structure 52. In some embodiments, the power signal P4 may pass through the substrate 10, the conductive structure 52 (e.g., conductive structure 521), the conductive pad 34, the through-via 33, the active circuit 31, the through-via 33, the conductive pad 34, and the conductive structure 52 (e.g., conductive structure 522). In some embodiments, the voltage (or power) of the power signal P4 may be different from the voltage (or power) of the power signal P1. In some embodiments, the voltage (or power) of the power signal P4 may be the same the voltage (or power) of the power signal P1.

In some embodiments, the substrate 10 may be configured to provide the electronic component 20 with a power signal P5. In some embodiments, the power signal P5 may pass through the surface 30*s*1 of the electronic component 30. In some embodiments, the power signal P5 may pass through the surface 20*s*2 of the electronic component 20. In some embodiments, the power signal P5 may further pass through the conductive structure 52. In some embodiments, the power signal P5 may pass across the surface 20*s*3 of the electronic component 20. In some embodiments, the power signal P5 may pass through the substrate 10, the conductive structure 52 (e.g., conductive structure 521), the conductive pad 34, the through-via 23, the active circuit 21, the through-via 23, the conductive pad 34, and the conductive structure 52 (e.g., conductive structure 521). In some embodiments, the electronic component 30 may include circuits, pads and/or traces formed on, over, and/or below the surface 30*s*1 of the electronic component 30, and the power signal P5 may be transmitted to the active circuit 21 of the electronic component 20 by passing through the circuits, pads and/or traces. In some embodiments, the voltage (or power) of the power signal P5 may be different from the voltage (or power) of the power signal P2. In some embodiments, the voltage (or power) of the power signal P5 may be the same the voltage (or power) of the power signal P2. In some embodiments, the voltage (or power) of the power signal P5 may be different from the voltage (or power) of the power signal P4. In some embodiments, the voltage (or power) of the power signal P5 may be the same the voltage (or power) of the power signal P4.

In this embodiment, the electronic component 30 may receive the power signals from the conductive structure 52, which may provide a relatively short path and thus reduce the signal loss. Further, the electronic component 30 may receive power signals from both the surfaces 30*s*1 and 30*s*2 of the electronic component 30, which may increase the number of I/O terminals 322.

In this embodiment, the electronic component 20 may receive the power signals from both the surfaces 20*s*1 and 20*s*2 of the electronic component 20, which may increase the number of I/O terminals 222.

Figure 3:
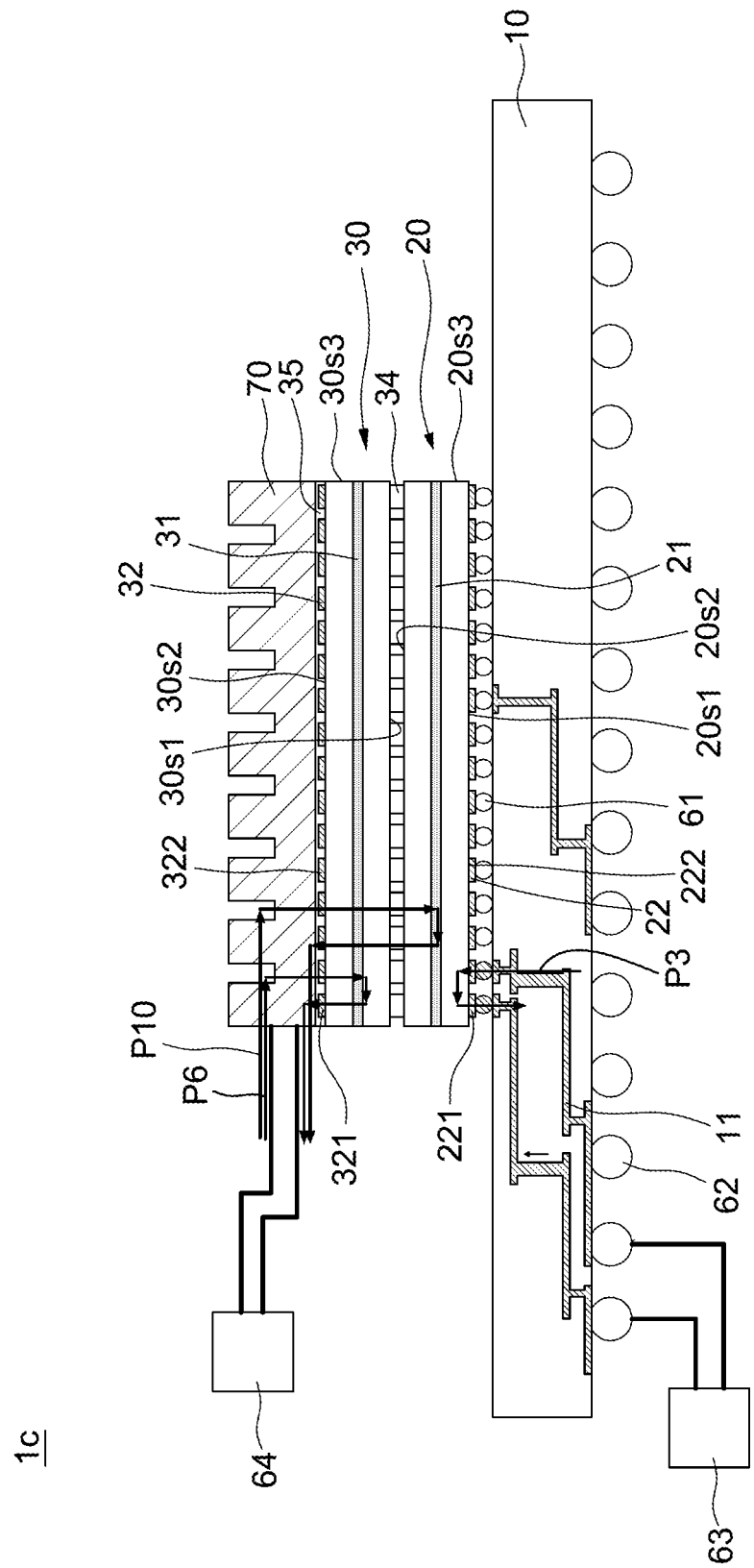
FIG. 3 illustrates a cross-sectional view of an example of an electronic device according to some embodiments of the present disclosure.

FIG. 3 illustrates a cross-sectional view of an example of an electronic device 1*c* according to some embodiments of the present disclosure. The electronic device 1*c* is similar to the electronic device 1*a* as shown in FIG. 1, and the differences therebetween are described below.

In some embodiments, the electronic device 1*c* may further include a heat dissipating element 70. In some embodiments, the heat dissipating element 70 may be disposed on the surface 30*s*2 of the electronic component 30. In some embodiments, the heat dissipating element 70 may be configured to provide a path of heat dissipation for electronic device 1*c*. In some embodiments, the heat dissipating element 70 may be configured to provide the electronic component 20 with a power signal. In some embodiments, the heat dissipating element 70 may include a conductive pattern (not shown) on a surface 70*s*1 of the heat dissipating element 70. For example, conductive pad(s) and insulative material(s) may be disposed on the surface 70*s*1 of the heat dissipating element 70 to define the conductive pattern (or a heat dissipating pattern). The bulk of the heat dissipating element 70 may include conductive materials, such as copper (Cu), aluminum (Al), tungsten (W), titanium (Ti), tantalum (Ta), or other applicable materials. The heat dissipating element 70 may be electrically connected to a power source 64.

In some embodiments, the electronic device 1c may further include a thermal interface material (TIM) 35. The TIM 35 may be disposed on the surface 30s2 of the electronic component 30. In some embodiments, the TIM 35 may be disposed between the electronic component 30 and the heat dissipating element 70. The TIM 35 may include, metal or other suitable materials.

In some embodiments, the substrate 10 may be electrically connected between the power source 64 and the heat dissipating element 70. In some embodiments, the power source 64 may be electrically connected to the heat dissipating element 70 and free of passing the substrate 10. In some embodiments, traces or circuits (not shown) may be disposed within the heat dissipating element 70. The traces or circuits may be electrically isolated from the heat dissipating element 70. The traces or circuits may be configured to serve as a path for transmitting a power from the power source 64 so that the heat dissipating element 70 may be used in thermal dissipation.

In some embodiments, the heat dissipating element 70 may be configured to provide the electronic component 30 with a power signal P6. In some embodiments, the power signal P6 may pass through the heat dissipating element 70. In some embodiments, the power signal P6 may pass through the surface 30s2 of the electronic component 30. In some embodiments, the power signal P6 may pass through the heat dissipating element 70, the power terminals 321, the active circuit 31, and the power terminals 32, and the heat dissipating element 70.

In some embodiments, the heat dissipating element 70 may be configured to provide the electronic component 20 with a power signal P10. In some embodiments, the power signal P10 may be transmitted to the electronic component 20 by passing through the electronic component 30.

In this embodiment, the heat dissipating element 70 may also function as a power supply. The heat dissipating element 70 may further assist in heat dissipation of the electronic component 30 and the electronic device 1c.

In some embodiments, the substrate 40 as shown in FIG. 2 may be replaced by the heat dissipating element 70. In this embodiment, the power signal P2 may pass through the heat dissipating element 70.

Figure 4:
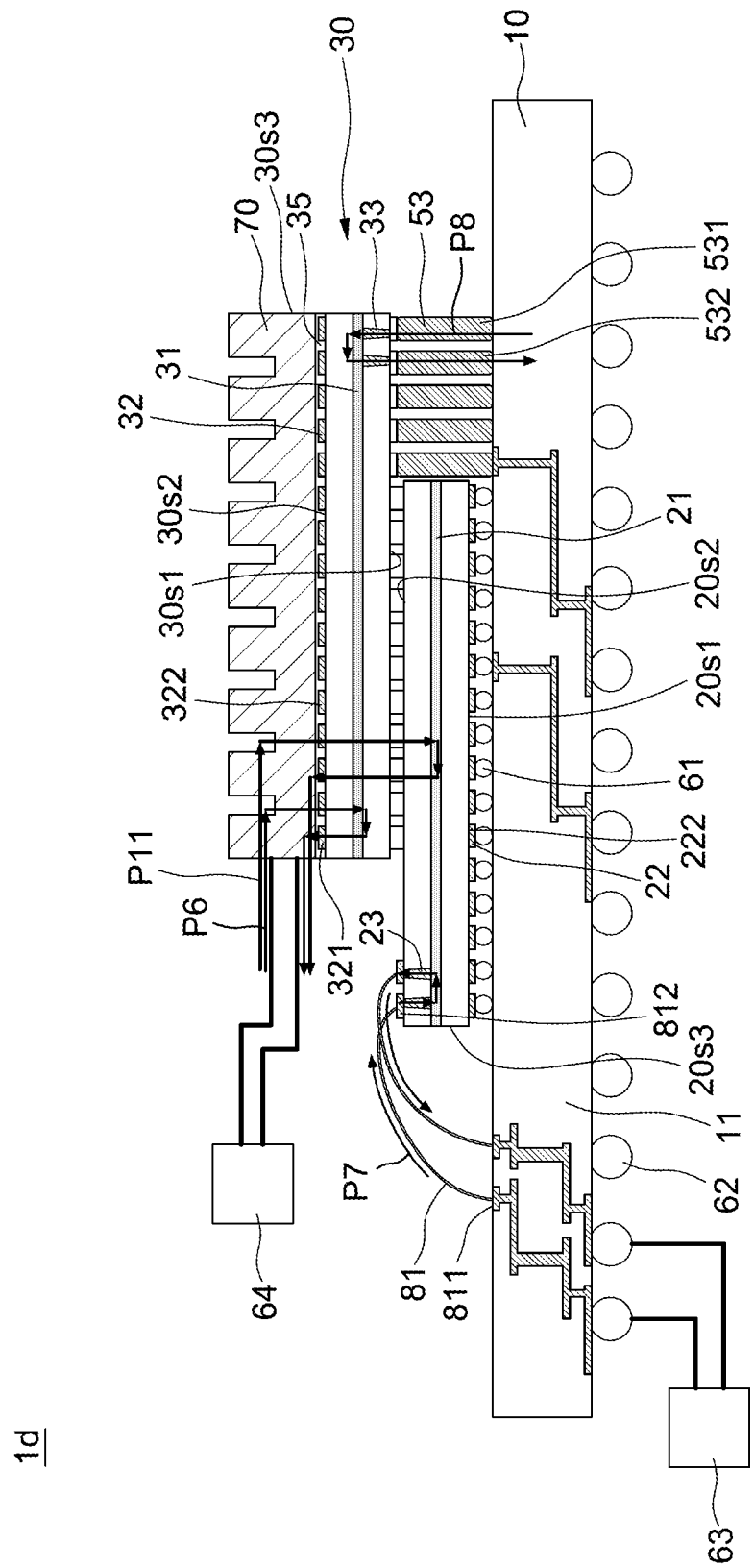
FIG. 4 illustrates a cross-sectional view of an example of an electronic device according to some embodiments of the present disclosure.

FIG. 4 illustrates a cross-sectional view of an example of an electronic device 1d according to some embodiments of the present disclosure. The electronic device 1d is similar to the electronic device 1c as shown in FIG. 3, and the differences therebetween are described below.

In some embodiments, the surface 20s3 of the electronic component 20 may be misaligned to the surface 30s3 of the electronic component 30.

In some embodiments, the electronic device 1d may further include conductive structures 53. In some embodiments, the conductive structure 53 may be disposed on the substrate 10. In some embodiments, the conductive structure 53 may be disposed on the surface 30s1 of the electronic component 30. In some embodiments, the conductive structure 53 may be disposed between the substrate 10 and the electronic component 30. In some embodiments, the conductive structure 53 may be disposed adjacent to the surface 20s3 of the electronic component 20. In some embodiments, the conductive structure 53 may be configured to electrically connect the substrate 10 and the electronic component 30. In some embodiments, the conductive structure 53 may be a conductive pillar or other suitable elements.

In some embodiments, the electronic device 1d may further include bonding wires 81. In some embodiments, the bonding wire 81 may have an end 811 connected to the substrate 10. In some embodiments, the bonding wire 81 may have an end 812 connected to the surface 20s2 of the electronic component 20. In some embodiments, the bonding wire 81 may extend across the surface 20s3 of the electronic component 20. The bonding wire 81 may be configured to provide the electronic component 20 with a power signal.

In some embodiments, the substrate 10 may be configured to provide the electronic component 20 with a power signal P7. In some embodiments, the power signal P7 may pass through the bonding wire 81. In some embodiments, the power signal P7 may pass through the surface 20s2 of the electronic component 20. In some embodiments, the power signal P7 may pass through the substrate 10, the bonding wire 81, the through-via 23, the active circuit 21, the through-via 23, and the bonding wire 81.

In some embodiments, the substrate 10 may be configured to provide the electronic component 30 with a power signal P8. In some embodiments, the power signal P8 may pass through the conductive structure 53. In some embodiments, the power signal P8 may pass through the surface 30s1 of the electronic component 30. In some embodiments, the power signal P8 may pass through the substrate 10, the conductive structure 53 (e.g., conductive structure 531), the through-via 33, the active circuit 31, the through-via 33, and the conductive structure 53 (e.g., conductive structure 532). In some embodiments, the conductive structure 53 may be included in a path of signal transmission from the electronic component 30 to the substrate 10. In some embodiments, the electronic component 30 may include circuits, pads and/or traces formed on, over, and/or below the surface 30s1 of the electronic component 30. The power signal P8 may be transmitted to the active circuit 31 of the electronic component 30 from the conductive structure 53 by passing through the circuits, pads and/or traces.

In this embodiment, the electronic component 30 may receive power signals from both the surfaces 30s1 and 30s2 of the electronic component 30, which may increase the number of I/O terminals 322.

In some embodiments, the heat dissipating element 70 may be configured to provide the electronic component 20 with a power signal P11. In some embodiments, the power signal P11 may be transmitted to the electronic component 20 by passing through the electronic component 30.

Figure 5:
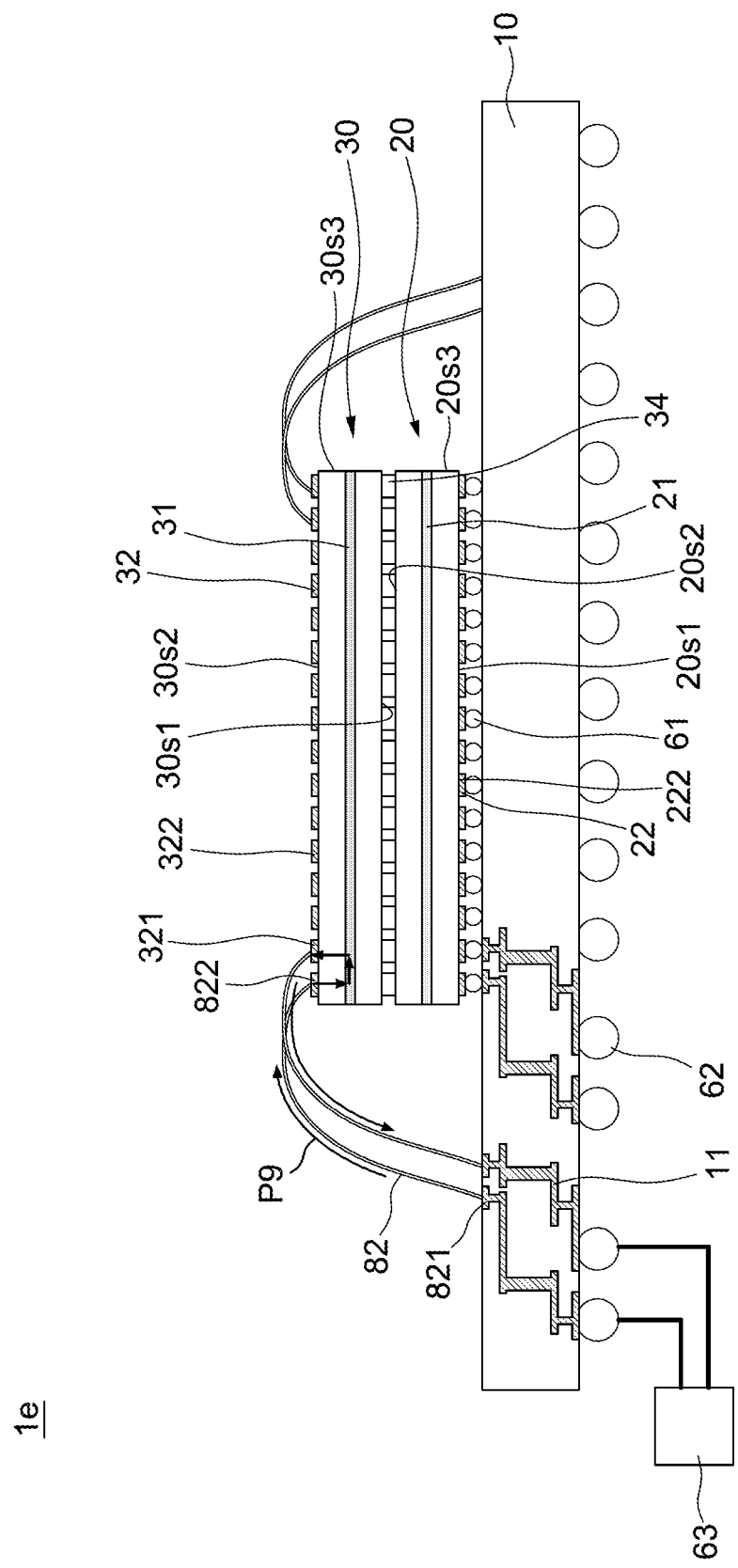
FIG. 5 illustrates a cross-sectional view of an example of an electronic device according to some embodiments of the present disclosure.

FIG. 5 illustrates a cross-sectional view of an example of an electronic device 1e according to some embodiments of the present disclosure. The electronic device 1e is similar to the electronic device 1a as shown in FIG. 1, and the differences therebetween are described below.

In some embodiments, the electronic device 1e may further include bonding wires 82. In some embodiments, the bonding wire 82 may have an end 821 connected to the substrate 10. In some embodiments, the bonding wire 81 may have an end 822 connected to the surface 30s2 of the electronic component 30. In some embodiments, the bonding wire 82 may extend across the surface 20s3 of the electronic component 20. In some embodiments, the bonding wire 82 may extend across the surface 30s3 of the electronic component 30. The bonding wire 82 may be configured to provide the electronic component 30 with a power signal.

In some embodiments, the substrate 10 may be configured to provide the electronic component 30 with a power signal P9. In some embodiments, the power signal P9 may pass through the bonding wire 82. In some embodiments, the power signal P9 may pass through the surface 30s2 of the electronic component 20. In some embodiments, the power signal P9 may pass through the substrate 10, the bonding wire 82, the terminals 32 (e.g., power terminal 321), the active circuit 31, the power terminals 321, and the bonding wire 82. In some embodiments, the bonding wire 82 may be included in a path of signal transmission from the electronic component 30 to the substrate 10. In some embodiments, the electronic component 30 may include circuits, pads and/or traces formed on, over, and/or below the surface 30s2 of the electronic component 30. The power signal P9 may be transmitted to the active circuit 31 of the electronic component 30 from the bonding wire 82 by passing through the circuits, pads and/or traces.

In some embodiments, the power terminal 321 of the terminals 32 may surround the I/O terminal 322. In this embodiment, the electronic component 20 may be free of conductive structure(s), such as conductive pillars, on the surface 20s2 of the electronic component 20, which may reduce costs.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
   a first die; and
   a second die disposed over the first die and having a backside surface facing a backside surface of the first die,
   wherein an active surface of the second die is configured to receive a first power, the second die is configured to provide the first die with a second power through the backside surface of the second die and the backside surface of the first die,
   wherein a density of a plurality of terminals located at an active surface of the first die is greater than a density of a plurality of terminals located at the active surface of the second die.

2. The electronic device of claim 1, wherein the first die is configured to receive a third power.

3. The electronic device of claim 2, wherein the third power is transmitted to pass through the active surface of the first die.

4. The electronic device of claim 2, wherein the third power is transmitted from the second die, and the third power is different from the second power.

5. The electronic device of claim 1, wherein the first power is transmitted to an active circuit region of the second die through a through-silicon via (TSV) of the second die, and the second power is transmitted to an active circuit region of the first die through a TSV of the first die.

6. The electronic device of claim 1, wherein the first power is transmitted across a lateral surface of the second die.

7. An electronic device, comprising:
a first die; and
a second die disposed over the first die,
wherein the first die is configured to receive a first power and a second power, the first power is transmitted from the second die, the second power is free from passing through the second die, and the first power is different from the second power.

8. The electronic device of claim 7, wherein the second power is transmitted to pass through a backside surface of the first die.

9. The electronic device of claim 7, wherein a lateral surface of the first die is misaligned with a lateral surface of the second die, and a portion of a backside surface of the second die is exposed by the first die.

10. The electronic device of claim 9, wherein the second power is transmitted to the first die through a circuit disposed under the backside surface of the second die.

11. The electronic device of claim 9, further comprising:
a conductive structure disposed adjacent to the lateral surface of the first die, wherein the conductive structure is electrically connected to a circuit disposed under the backside surface of the second die.

12. The electronic device of claim 11, wherein the second power is transmitted to the first die through the conductive structure and the circuit.

13. The electronic device of claim 7, wherein the second die is configured to receive a third power, wherein the third power is transmitted to an active circuit region of the second die through a backside surface of the second die.

14. The electronic device of claim 13, wherein the third power is transmitted across a side of the first die.

15. An electronic device, comprising:
a first substrate;
a first electronic component disposed over the first substrate and having a backside surface; and
a second electronic component disposed over the backside surface of the first electronic component, wherein the second electronic component has a backside surface facing the backside surface of the first electronic component,
wherein the first electronic component is configured to receive a first power passing through the backside surface of the first electronic component and a second power different from the first power,
and wherein the first power is transmitted from the second electronic component, and the second power is transmitted from the first substrate, and wherein the second power is free from passing through the second electronic component.

16. The electronic device of claim 15, further comprising:
a second substrate disposed over the second electronic component, wherein the second substrate is configured to receive the first power which passes across a lateral surface of the second electronic component.

17. The electronic device of claim 15, further comprising:
a heat dissipating element disposed over the second electronic component, wherein the heat dissipating element is configured to transmit an external power to the second electronic component.

18. The electronic device of claim 17, wherein the first power is transmitted from the second electronic component.

* * * * *